United States Patent [19]

Hikmet et al.

[11] Patent Number: 5,748,271
[45] Date of Patent: May 5, 1998

[54] ELECTROLUMINESCENT DEVICE HAVING ELECTROLUMINESCENT COMPOUND AND LIQUID CRYSTALLINE COMPOUND

[75] Inventors: Rifat A.M. Hikmet; David B. Braun; Aemilianus G.J. Staring; Hermannus F.M. Schoo; Johan Lub, all of Eindhoven, Netherlands

[73] Assignee: U.S. Philips Corporation, New York, N.Y.

[21] Appl. No.: 700,909

[22] Filed: Aug. 21, 1996

[30] Foreign Application Priority Data

Aug. 21, 1995 [EP] European Pat. Off. ............ 95202250

[51] Int. Cl.$^6$ ........................ G02F 1/1335; H05B 33/14
[52] U.S. Cl. ....................... 349/69; 349/164; 349/139; 313/504
[58] Field of Search ..................... 349/69, 164, 70, 349/165, 61, 139, 193, 126; 313/502, 503, 504, 498, 499, 511; 257/10, 79, 40, 103; 362/34, 84, 800

[56] References Cited

U.S. PATENT DOCUMENTS 3,775,631  11/1973  Morikawa ........................... 349/69
4,892,292  1/1990  Broer ............................... 350/339 R

FOREIGN PATENT DOCUMENTS 9216023  9/1992  European Pat. Off. .
2229822  12/1990  Japan .
9603015  2/1996  WIPO .

OTHER PUBLICATIONS

Influence of Chemical Polymerization Conditions on the Properties of Polyaniline, Yong Cao et al, Polymer, 1989, vol. 30, Dec. 1989.

Nature, G. Gustafsson et al, vol. 357, pp. 477–479 –Jun. 1992.

"Polarized Electroluminescence from Rubbing–Aligned Poly(2,5–dionyloxy–1,4,–phenylenevinylene)Films", by Hamaguchi et al, Appl. Phys. Letter 67, Dec. 4, 1995, pp. 3381–3383.

Primary Examiner—William L. Sikes
Assistant Examiner—Tai V. Duong

[57] ABSTRACT

A description is given of an electroluminescent device (1) having an LED structure, which is composed of an active layer (7) of oriented liquid-crystalline and electroluminescent compounds and a transparent positive electrode layer (5) which is preferably made from an electroconductive polymer. By previously rubbing the electrode layer (5) in one direction with a velvet cloth, an orientation is induced in the molecules in the active layer (7), the orientation being frozen by cooling or polymerization. The electroluminescent device (1) emits polarized light whose direction of polarization is parallel to the direction of rubbing.

7 Claims, 1 Drawing Sheet

ELECTROLUMINESCENT DEVICE HAVING ELECTROLUMINESCENT COMPOUND AND LIQUID CRYSTALLINE COMPOUND

BACKGROUND OF THE INVENTION

The invention relates to an electroluminescent device comprising an anisotropic active layer of an oriented electroluminescent organic compound, which layer is situated between two electrode layers, at least one electrode layer being transparent to the light to be emitted, and, in operation, said device emitting polarized light. The invention also relates to a method of manufacturing an electroluminescent (EL) device which can emit polarized light. The invention further relates to the use of such an EL device.

The active layer and the two electrode layers jointly constitute a light-emitting diode (LED) which operates on a direct voltage in the range between approximately 4 and 20 volts. An EL device emits light when an electric field is applied across the active or emissive layer. Such a device cannot only be used as a display but also, for example, as a light source, for example as a backlight for an LCD display.

The use of inorganic materials such as GaAs for the active layer has been known for a long time. Since a few years also organic materials which can be used for the active layer are known, for example semiconductive organic polymers and metal chelate complexes, such as 8-hydroxyquinoline aluminium ($Alq_3$). Semiconductive organic polymers have a conjugated polymer chain. A well-known polymer is, for example, poly(p-phenylene vinylene) (PPV), in particular 2,5-substitued PPV. The band gap, the electron affinity and the ionization potential can be adjusted by choosing the proper conjugated polymer chain and proper side chains. Unlike electrically conducting polymers, these conjugated polymers are undoped. In addition, such polymers enable flexible substrates to be used.

The active layer of an organic polymer is situated between two electrode layers of electroconductive materials, namely one for the injection of holes and one for the injection of electrons into the active layer. The active layer may optionally be bounded by one or more layers which improve the performance of the device, such as an electron-transport layer which prevents the transport of holes and a hole-transport layer which prevents the transport of electrons. At least one of the electrode layers is transparent to the light to be emitted.

For certain applications it is desirable that the EL device emits polarized light. This effect can be achieved, inter alia, by stretching a combination of a layer of a conjugated polymer provided on polyethene foil in one direction. This causes the chains of the conjugated polymer to be oriented in the direction of stretching, so that an optically anisotropic material is obtained. The direction of polarization of the emitted light is parallel to the direction of stretching.

International Patent Application WO 92/16023 also discloses a method of manufacturing a polymeric LED which emits polarized light. For this purpose a heated mixture of a conjugated polymer such as PPV, a carrier polymer such as polyethene and a solvent are poured on to a glass plate and subsequently cooled. The gel layer obtained is dried, thereby forming a film. This film is removed from the glass plate and subsequently stretched in one direction. By orientation of the PPV chains, polarized light is emitted in an LED structure. A disadvantage of the known method is that first a very thin self-supporting oriented film must be manufactured, which must subsequently be provided with electrode layers on both sides to complete the LED. The thickness of the active layer is only approximately 100 nm, so that a film of such thickness is difficult to handle during further processing steps. In addition, such an oriented active layer cannot be manufactured by providing a conjugated polymeric compound on an inflexible substrate such as a glass plate.

OBJECTS AND SUMMARY OF THE INVENTION

It is an object of the invention to provide, inter alia, an alternative EL device which, in operation, emits polarized light. The invention also aims at providing a simple method of manufacturing such an EL device.

These objects are achieved by an EL device as described in the opening paragraph, which is characterized in accordance with the invention in that the electroluminescent compound also comprises an oriented liquid-crystalline unit or is mixed with an oriented liquid-crystalline compound. In accordance with the invention, a liquid-crystalline (LC) compound is used to obtain the desired orientation for the electroluminescent (EL) compound.

Such LC compounds can readily be oriented in the liquid-crystalline state by means of one of the known methods for orienting the molecules of LC compounds. In one of said known methods, use is made of an external electric or magnetic field which orients the molecules of the LC compound in the direction of the field lines. In another method use is made of an elongational flow in which the LC molecules are oriented in the direction of the liquid flow.

Preferably, at least one electrode layer comprises an orientation-inducing surface. To this end, the surface of the electrode layer may be provided with a monomolecular layer of a surfactant or of a vapour-deposited silicon-oxide layer. The provision of microgrooves also induces orientation of the LC molecules. The simplest orientation process consists in providing a layer of the LC compound in the liquid-crystalline state on a surface rubbed in one direction, for example with a velvet cloth or felt. The rubbed surface causes the molecules of the LC compound, particularly the mesogenic groups contained therein, to be oriented in the direction of rubbing. As a result of the orientation of the LC molecules, the molecules of the EL compound in the layer will also be oriented in the same direction (guest-host effect). The orientation of the molecules can be fixed by freezing (thermotropic LCs), evaporation of the solvent (lyotropic LCs) or by (photo)polymerization, for example, of LC acrylates, thereby forming a solid anisotropic active layer.

A well-known material which can induce orientation by friction and which is often used in LCD cells is polyimide. Due to its electrically insulating properties, however, this material cannot be used in the customary thickness in an EL device because in said device a current runs from the first electrode layer through the active layer to the second electrode layer. If polyimide is used, the layer may contain maximally a few monolayers of polyimide. Preferably, an electroconductive polymer layer is used as the orientation layer. It has been found that after electroconductive polymers have been rubbed in one direction, they are capable of inducing an orientation in the molecules of an LC compound. The electroconductive polymer layer may be provided on one of the electrode layers, but can also be used itself as one of the electrode layers of the EL device.

The electroconductive polymer layer preferably comprises poly-3,4-ethylene dioxythiophene or polyaniline. These polymers have the advantage that they are transparent to visible light, so that such a polymer layer can also serve as a positive transparent electrode layer of an EL device and can suitably be used for the injection of holes into the active layer.

An electroconductive polymer layer which is used as a positive electrode layer in an EL device is known per se from an article by G. Gustafsson et al., in Nature, Vol. 357, pp. 477-479, in which article it is proposed to replace the transparent indium-tin oxide (ITO) by polyaniline (PANI). Said article does not propose, however, the use of LC compounds to obtain polarized light.

The object of providing a simple method of manufacturing an electroluminescent device which emits polarized light is achieved in accordance with the invention by a method comprising the following process steps:

providing a substrate with a transparent electroconductive polymer layer as the first electrode layer;

unidirectionally rubbing the polymer layer in a direction of orientation;

applying a liquid layer of organic compounds having liquid-crystalline and electroluminescent properties, the compounds being oriented parallel to the direction of orientation;

converting the liquid layer to a solid state so that the orientation of the compounds is fixed, thereby forming an anisotropic active layer;

providing the active layer with a second electrode layer.

The layers for the EL structure are applied to a substrate which is composed, for example, of glass, quartz glass, ceramic or synthetic resin materials. Preferably, a translucent or transparent substrate is used, for example a transparent flexible foil of a synthetic resin. Suitable transparent synthetic resins are, for example, polyimide and polyesters such as polyethylene terephtalate and polycarbonate.

The first electrode layer serves as the electrode for the injection of holes into the active layer and is formed by a transparent electroconductive polymer layer. To provide this layer use can be made of all methods which are known per se, but preferably the polymer layer is provided by spin coating of a solution. In this case, the solution comprises the electroconductive polymer or monomers which are polymerized into an electroconductive polymer by means of oxidation. Suitable electroconductive polymers are, for example, polyaniline (PANI), which is described in the above-mentioned article by G. Gustafsson, and poly-3,4-ethylene dioxythiophene (PEDOT). A polymer layer of PANI has a square resistance of 1 kΩ/square at a layer thickness of 200 nm. A polymer layer of PEDOT has a square resistance of 240 Ω/square at a layer thickness of 140 nm. The layer thickness of the polymer layer obtained is governed, inter alia, by the concentration of the polymer or monomer in the solution and by the number of revolutions during spin coating.

The electroconductive polymer layer thus obtained is subsequently rubbed in one direction with a velvet cloth or felt. The direction of rubbing should usually be parallel to the direction of polarization of the light to be emitted by the EL device.

The first electrode layer is provided with a liquid layer of organic compounds having LC and EL properties. This can be achieved by means of a mixture which comprises two types of compounds, namely a compound having LC properties and a compound having EL properties. In such a mixture, the EL compound is the guest of the LC host. LC compounds are commercially available in ample measure. Well-known examples are p-azoxyanisole; 4-methoxy benzylidene-4'-cyanoaniline; di-4-methoxy benzylidene-2,2'-dichloro-4,4'-diaminobiphenyl; di-4-methoxy benzylidene-2,6-diaminonaphtalene; 2-hydroxy-3,6 -bis(4-n-butyl phenyl)pyrazine; bis-2,5-(4-methoxybenzylidene) cyclopentanone; 4-n-octyloxybenzoic acid; p-butoxyphenyl-p-hexyloxybenzoate; p-butyl phenyl-p-toluate and compounds on the basis of phenyl cyclohexane, biphenyl cyclohexane and cyanobiphenyl. LC monoacrylate and diacrylate monomers can also be used. In the liquid phase, the molecules of the LC compounds are oriented parallel to the direction of rubbing. An optimum orientation is obtained by orienting the LC compounds in the nematic phase.

For the EL compounds use can be made of oligomers, polymers and copolymers which are composed of arylene units or arylene-vinylene units. A well-known compound is poly(p-phenylene vinylene) (PPV) and the 2,5-substituted derivatives thereof. Also some organic dichroic dyes exhibiting EL properties, such as perylene dyes, can be used. The molecules of these dyes have a molecular longitudinal axis which is longer than an axis at right angles thereto and hence exhibit optically anisotropic behaviour. As a result of the orientation of the LC molecules, the molecules of the EL compounds will be oriented in the same direction (guest-host effect).

It is evident that orientation of the molecules is possible only if the mixture of the EL and LC compounds is in the liquid phase. This is a matter of temperature. The layer of LC and EL compounds must be brought to a temperature which is higher than the transition temperature from the crystalline- or glass phase to the liquid-crystalline phase and lower than the transition temperature from the liquid-crystalline phase to the isotropic phase. After having been melted, the compounds can optionally be oriented in the undercooled phase at temperatures below the melting point.

The EL and LC compounds are optionally dissolved in a solvent, so that the compounds can be provided on the first electrode layer, for example by spin coating, from a solution. After evaporation of the solvent, the compounds are heated until they are in the liquid phase, so that they can orient themselves in the direction of rubbing.

The orientation in the layer of EL and LC compounds should subsequently be frozen by a conversion from the liquid phase to a solid phase. If the crystallization temperature of the compounds is above room temperature, the layer can be cooled to room temperature in a simple manner, thereby freezing the orientation of the molecules. Owing to the orientation, the active layer obtained is optically anisotropic. The thickness of the active layer mostly ranges between 50 and 200 nm.

A second electrode layer is applied to the active layer. Said second electrode layer serves as the electrode for the injection of electrons into the active layer. The material for this layer has a low work function and is made, for example, from indium, aluminium, calcium, barium or magnesium. Particularly when reactive barium is used, it is efficacious to cover this second electroconductive layer with a protective coating, for example, of epoxy or an inert metal. This electrode layer can be provided on the substrate by means of a method which is known per se, such as vapour-deposition, sputtering or a CVD process. The thickness of this second electrode layer ranges from 10 to 500 nm. If a thin, second electrode layer is used, the light emitted by the active layer is passed by this second electrode layer and by the transparent first electrode layer; in this case, the LED emits light to two sides. In the case of a thick, second electrode layer (a layer thickness of approximately 100 nm and more) the light emitted towards this electrode layer is reflected in the direction of the transparent first electrode layer; the LED then emits light to one side. If necessary, one or more electron- and/or hole-transport layers can be provided.

In the above-described method use is made of a mixture of organic EL and LC compounds. The LC and EL properties can also be combined in one type of organic compounds, such as polymeric compounds in which alternating LC and EL units form the polymeric backbone. Such compounds are for example disclosed in the abstract of Japanese Patent Application JP-A-2-229822. Examples of other polymeric compounds are those in which the backbone is formed by LC units and provided with EL side groups, or conversely: the backbone is composed of EL units and provided with LC side groups. The polymer can alternatively be composed of a flexible backbone to which EL and LC side groups are alternately attached. In this case, orientation of the LC units in such polymers does not necessarily lead to a unidirectional orientation of the EL units. Orientation of LC side groups, for example, in the direction of rubbing can then lead to orientation of the EL units in the backbone in a direction perpendicular thereto.

In the above-mentioned examples of mixtures of compounds having LC and EL properties, the concentration of the EL compound in the mixture is limited because the LC property of the mixture decreases as the concentration increases. In general, the concentration of LC compounds must be at least 50 vol. %.

An interesting group of LC compounds is formed by LC diacrylate monomers as mentioned, for example, in U.S. Pat. No. 4,892,392, in the name of the current Applicant. Such LC monomers often are in the solid state at room temperature but can be oriented very rapidly in the liquid-crystalline state. After orientation of the LC monomers and of the EL compounds added, the LC monomers are polymerized to form a solid phase of a three-dimensional network. The polymerization process is carried out by exposure to light, in particular UV-light. To this end, the LC monomers to be polymerized are preferably mixed with a photoinitiator in a quantity of 0.1–5 wt. %. As a result of said polymerization, the imposed orientation of the LC monomers is fixed. Also the orientation of the EL compounds is fixed as a result of the polymerization of the LC monomers. The LC diacrylate monomers may optionally be mixed with a high concentration of volatile non-reactive LC molecules. After orientation and polymerization of the LC diacrylate monomers, a gel-like oriented network is obtained. After evaporation of the volatile non-reactive LC molecules from the network, a high concentration of EL compounds remains.

An EL device in accordance with the invention emits polarized light whose direction of polarization is parallel to the direction of orientation of the molecules of the EL compound. Such an EL device can for example be used as a backlight of a liquid-crystal display device. As a result of the polarized light emitted, one of the polarization filters of the liquid-crystal display can be dispensed with. This leads to a simpler construction of the display and to a lower current consumption of the backlight.

These and other aspects of the invention will be apparent from and elucidated with reference to the embodiments described hereinafter.

DETAILED DESCRIPTION OF THE PREFERRED EMBODIMENT

Exemplary embodiment 1

A quantity of 0.35 mmol 3,4-ethylene dioxythiophene (EDOT, Supplier Bayer AG) is mixed with a solution of 0.81 mmol tris(toluene sulphonate) Fe(III) and 0.25 mmol imidazole in 1.5 g 1-butanol. The solution obtained is filtered through a 0.5μm filter. At room temperature, the solution is stable for at least 12 hours.

A layer of this solution is spin coated on to a glass substrate. The layer thus obtained is dried and, subsequently, heated to 110° C. for 1 minute, thereby forming electroconductive poly-3,4-ethylene dioxythiophene (PEDOT). After cooling of the layer, the Fe-salts are extracted from the layer by means of 1-butanol. After said extraction, the average layer thickness is 140 nm and the square resistance is 240 Ω/square. The layer of PEDOT thus formed is transparent and serves as the electrode layer for injecting holes into the active layer to be provided later.

Figure 1:
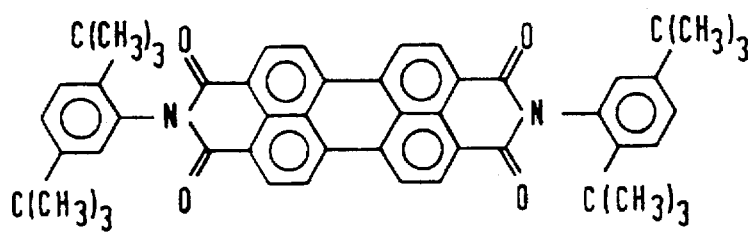
FIG. 1 shows the structural formula of an EL compound for the active layer of an EL device in accordance with the invention.
Figure 2:
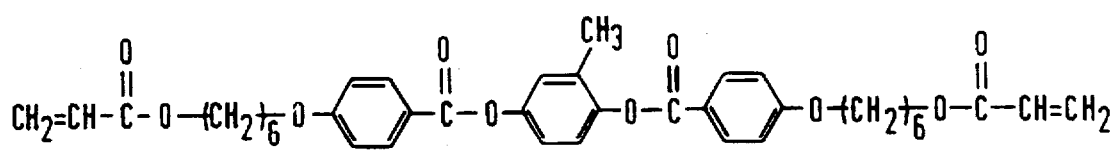
FIG. 2 shows the structural formula of an LC compound for the active layer of an EL device in accordance with the invention.

The surface of the PEDOT-layer is rubbed in one direction by means of a velvet cloth. This direction of rubbing determines the orientation of the molecules of the mixture of LC and EL compounds to be provided hereafter. This mixture is prepared from 0.1 wt. % of the dichroic perylene dye N, N'-bis-(2,5-di-ter-butyl-phenyl)-3,4,9, 10-perylene dicarboxymide (supplier Aldrich Chemicals), the structural formula of which is shown in FIG. 1, and 99.8 wt. % of an LC diacrylate monomer the structural formula of which is shown in FIG. 2. The mixture also comprises 0.1 wt. % of the photoinitiator 2,2-dimethoxy-2phenyl-acetophenone, supplier Ciba Geigy under the tradename Irgacure ® 651. The melting point of the mixture is 86° C., and the transition to the isotropic phase takes place at 116° C.

At a temperature of 90° C., a layer of this mixture is applied to the rubbed PEDOT-layer. The molecules of the LC compound (FIG. 2) are in the nematic phase and orient themselves in a direction parallel to the direction of rubbing of the PEDOT-layer. As a result of this orientation, the molecules of the dichroic EL dye (FIG. 1) orient themselves in the same direction (guest-host effect). The layer is cured by photopolymerization under the influence of exposure to UV-light originating from a low-pressure mercury-discharge lamp. The exposure time is 1 minute and the intensity is 0.05 mW/cm$^2$. When the layer is cured, the orientation is fixed and a solid, optically anisotropic, active layer is obtained. The layer thickness of the active layer is 100 nm.

Figure 3:
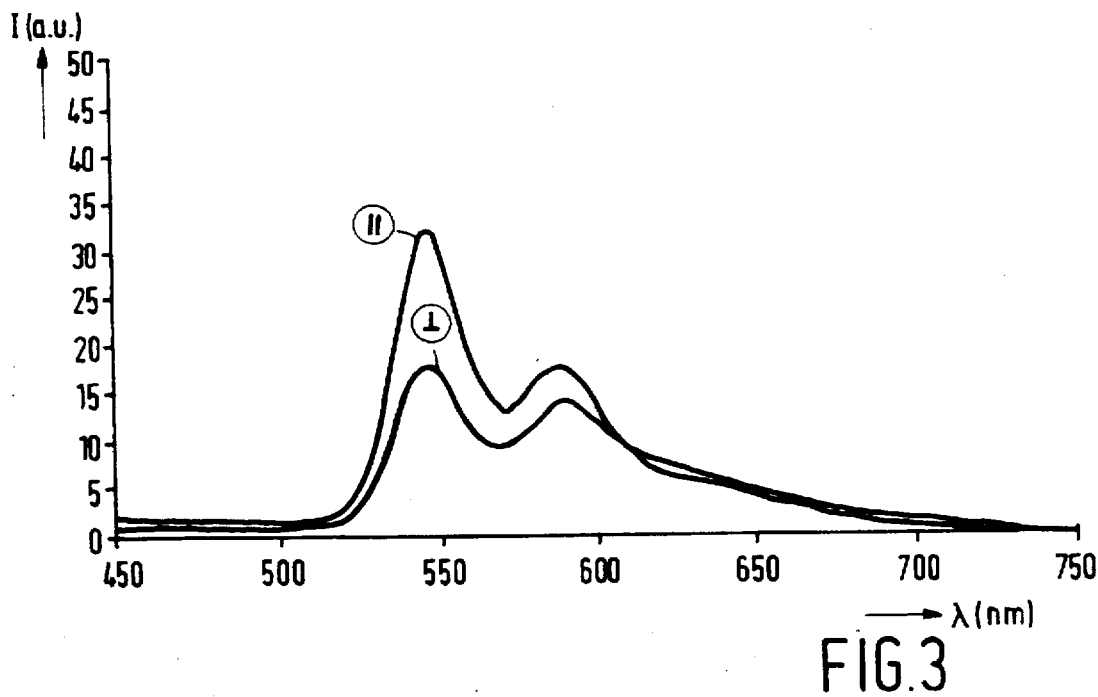
FIG. 3 shows the photoluminescence spectrum for two directions of polarization (// and ⊥) of an active layer in accordance with the invention.

By means of a Perkin-Elmer LS 50 luminescence spectrometer the photoluminescence spectrum of the active layer is measured. FIG. 3 shows the intensity I of the photoluminescence in arbitrary units (a.u.) as a function of the wavelength λ (in nm). The curves indicated by "//" and "⊥" show the intensities of the polarization components which extend, respectively, parallel and perpendicularly to the direction of rubbing of the PEDOT-layer. The polarization component of the emitted light extends predominantly parallel to the direction of orientation of the EL molecules, so that polarized light having a predetermined direction of polarization is obtained.

Exemplary embodiment 2

Figure 4:
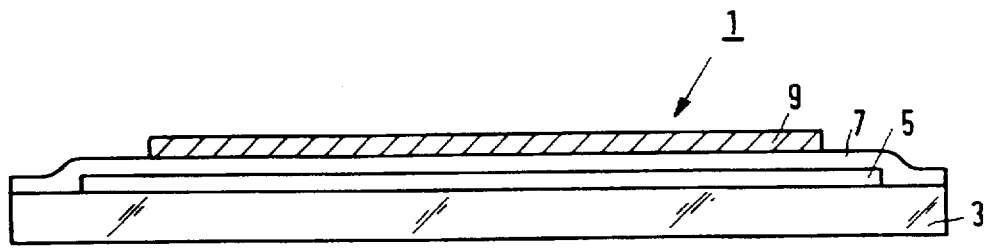
FIG. 4 is a schematic, cross-sectional view of an EL device in accordance with the invention.

FIG. 4 schematically shows an organic LED-structure bearing reference numeral 1. A glass substrate 3 is provided with a uniaxially rubbed, transparent, electroconductive PEDOT-layer 5, as described in exemplary embodiment 1. This layer 5 serves as the electrode layer for injecting holes into the active layer 7, which is to be provided hereafter and which is composed of LC and EL compounds, as described in exemplary embodiment 1. A calcium layer 9 is vapour-deposited on to the active layer 7 at a pressure below $2.10^{-4}$ Pa. Said calcium layer 9 has a thickness of 250 nm and serves as the electrode for injecting electrons into the active layer 7. Both electrode layers 5 and 9 are connected to a direct-current source. The LED emits green light with a maximum around $\lambda=530$ nm, the direction of polarization of which is substantially parallel to the direction of rubbing of the PEDOT-layer.

Exemplary embodiment 3

Exemplary embodiment 2 is repeated, however, in this case the electroconductive polymer layer 5 is manufactured from polyaniline (PANI). Conductive polyaniline is prepared by adding an aqueous solution of $(NH_4)_2S_2O_8$ to a hydrochloric-acid solution of aniline. The precipitated polyaniline is filtered-off and washed with water. This synthesis is described in an article by Y. Cao et al., Polymer, 30, 2305–2311 (1989). A quantity of 2 g of a coating solution is prepared, which consists of 0.5 wt. % conductive polyaniline in m-cresol. A layer of conductive PANI is spin coated on to the substrate 3. The layer is dried for 1 minute at 90° C., thereby forming a transparent electrode layer 5 of PANI having a thickness of 200 nm and a square resistance of 1 k$\Omega$/square. The layer is subsequently rubbed in one direction with a velvet cloth.

The method in accordance with the invention enables an organic LED which emits polarized light to be manufactured in a simple manner, an LC combination with an EL compound being oriented in the desired direction, for example, by rubbing a transparent electroconductive polymer layer which serves as the electrode layer.

We claim:

1. An electroluminescent device comprising an anisotropic active layer of an oriented electroluminescent organic compound, said layer situated between two electrode layers, at least one electrode layer being transparent to light to be emitted, and, in operation, said device emitting polarized light, wherein the oriented electroluminescent compound is mixed with an oriented liquid-crystalline compound.

2. An electroluminescent device as claimed in claim 1, wherein at least one electrode layer comprises an orientation-inducing surface.

3. An electroluminescent device as claimed in claim 2, wherein the electrode layer comprises an electroconductive polymer layer which is rubbed in one direction.

4. An electroluminescent device as claimed in claim 3, wherein the polymer layer comprises poly-3,4-ethylene dioxythiophene.

5. An electroluminescent device as claimed in claim 3, wherein the polymer layer comprises polyaniline.

6. A method of manufacturing an electroluminescent device as claimed in claim 3, which method comprises the following steps:

providing a substrate with a transparent electroconductive polymer layer as the first electrode layer;

unidirectionally rubbing the polymer layer in a direction of orientation;

applying a liquid layer of organic compounds having liquid-crystalline and electroluminescent properties, the compounds being oriented parallel to the direction of orientation;

converting the liquid layer to a solid state so that the orientation of the compounds is fixed, thereby forming an anisotropic active layer;

providing the active layer with a second electrode layer.

7. A method as claimed in claim 6, which further comprises the step of preparing a mixture of an organic electroluminescent compound and a liquid-crystalline compound prior to applying said liquid layer.

* * * * *